(12) United States Patent
Pendharkar et al.

(10) Patent No.: US 8,878,284 B2
(45) Date of Patent: Nov. 4, 2014

(54) PROGRAMMABLE SCR FOR LDMOS ESD PROTECTION

(75) Inventors: Sameer Pendharkar, Allen, TX (US);
Suhail Murtaza, Plano, TX (US);
Juergen Wittmann, Wannweil (DE)

(73) Assignee: Texas Instruments Incorporated, Dallas, TX (US)

( * ) Notice: Subject to any disclaimer, the term of this patent is extended or adjusted under 35 U.S.C. 154(b) by 108 days.

(21) Appl. No.: 13/460,523

(22) Filed: Apr. 30, 2012
(Under 37 CFR 1.47)

(65) Prior Publication Data
US 2013/0285137 A1 Oct. 31, 2013

(51) Int. Cl.
*H01L 29/66* (2006.01)

(52) U.S. Cl.
USPC .................. 257/328; 257/355; 257/E29.256

(58) Field of Classification Search
USPC ........... 257/328, 335, 339, 355, 360, E29.256
See application file for complete search history.

(56) References Cited

U.S. PATENT DOCUMENTS

| | | | |
|---|---|---|---|
| 5,895,960 A * | 4/1999 | Fritz et al. | 257/359 |
| 6,137,140 A | 10/2000 | Efland et al. | |
| 7,414,287 B2 | 8/2008 | Pendharkar et al. | |
| 7,687,853 B2 | 3/2010 | Pendharkar et al. | |
| 8,120,108 B2 | 2/2012 | Pendharkar | |
| 8,125,030 B2 | 2/2012 | Pendharkar | |
| 2008/0296669 A1 * | 12/2008 | Pendharkar et al. | 257/329 |

* cited by examiner

*Primary Examiner* — Tucker Wright
(74) *Attorney, Agent, or Firm* — Jacqueline J. Garner; Frederick J. Telecky, Jr.

(57) ABSTRACT

A protection circuit for a DMOS transistor comprises an anode circuit having a first heavily doped region of a first conductivity type (314) formed within and electrically connected to a first lightly doped region of the second conductivity type (310, 312). A cathode circuit having a plurality of third heavily doped regions of the first conductivity type (700) within a second heavily doped region of the second conductivity type (304). A first lead (202) is connected to each third heavily doped region (704) and connected to the second heavily doped region by at least three spaced apart connections (702) between every two third heavily doped regions. An SCR (400, 402) is connected between the anode circuit and the cathode circuit. The DMOS transistor has a drain (310, 312, 316) connected to the anode circuit and a source (304) connected to the cathode circuit.

19 Claims, 5 Drawing Sheets

PROGRAMMABLE SCR FOR LDMOS ESD PROTECTION

BACKGROUND OF THE INVENTION

Embodiments of the present embodiments relate to a semiconductor controlled rectifier (SCR) for electrostatic discharge (ESD) protection of lateral double-diffused metal oxide semiconductor (LDMOS) devices having a programmable switching voltage.

Referring to FIG. 1A, there is a current-voltage diagram of a semiconductor controlled rectifier (SCR) of the prior art. FIG. 1B is a simplified diagram of the SCR together with a double diffused metal oxide semiconductor (DMOS) transistor 114 as previously disclosed by Efland et al. (U.S. Pat. No. 6,137,140). The diagram of FIG. 1B illustrates the PNPN impurity layers and intervening junctions J1-J3 of the SCR. In particular, regions 120, 122, and 124 form a PNP transistor of the SCR. Regions 122, 124, and 126 form a NPN transistor of the SCR. Resistors 110 and 112 are shunt resistors that prevent forward bias voltages for the PNP and NPN transistors, respectively, during normal circuit operation. Here and in the following discussion it should be understood that a semiconductor controlled rectifier may also be called a silicon controlled rectifier or a thyristor as described by S. M. Sze, "Semiconductor Devices Physics and Technology" 148-156 (John Wiley & Sons 1985). In general, a silicon controlled rectifier is a special case of a semiconductor controlled rectifier that is specifically formed on a silicon substrate. The current-voltage diagram (FIG. 1A) shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches to a minimum holding voltage (Vh) and holding current (Ih) region 106. In this mode all three junctions J1-J3 are forward biased and the minimum holding voltage across the SCR may be as low as a single diode drop or approximately 0.7V. In holding region 106, therefore, the SCR functions as a near ideal switch with very little power dissipation during electrostatic discharge (ESD) stress due to the low holding voltage and holding current.

SCRs have been used for primary protection against ESD for several years. Protection circuit design with DMOS technology, however, presents special challenges due to the relatively high operating voltage and current. For example, DMOS devices may operate in the range of 20V to 100V for various applications. These operating conditions preclude most techniques for adjusting SCR switching voltage and holding voltage as disclosed in the prior art. The switching voltage of the SCR of FIG. 1B is typically determined by the avalanche threshold of p-n junction J2. Junction J2, therefore, is typically designed as a linear junction to withstand the relatively high operating voltage required by DMOS applications. This and other features of DMOS technology present several problems that are resolved by embodiments of the present invention as will become apparent in the following discussion.

BRIEF SUMMARY OF THE INVENTION

In a preferred embodiment of the present invention, a circuit for protecting a double diffused metal oxide semiconductor (DMOS) transistor is disclosed. The circuit includes an anode circuit having a first lightly doped region of a second conductivity type and having a first heavily doped region of a first conductivity type formed at a face of a substrate within and electrically connected to the first lightly doped region. The circuit further includes a cathode circuit having a second heavily doped region of the second conductivity type formed at the face of the substrate and having a plurality of third heavily doped regions of the first conductivity type within the second heavily doped region. A first conductive lead is connected to each third heavily doped region and connected to the second heavily doped region by at least three spaced apart connections between every two third heavily doped regions. A semiconductor controlled rectifier (SCR) is connected between the anode and the cathode circuit. The DMOS transistor has a drain connected to the anode circuit and a source connected to the cathode circuit.

DETAILED DESCRIPTION OF THE INVENTION

The preferred embodiments of the present invention provide significant advantages over semiconductor controlled rectifier (SCR) electrostatic discharge (ESD) protection circuits of the prior art for double diffused metal oxide semiconductor (DMOS) technology as will become evident from the following detailed description.

Figure 2:
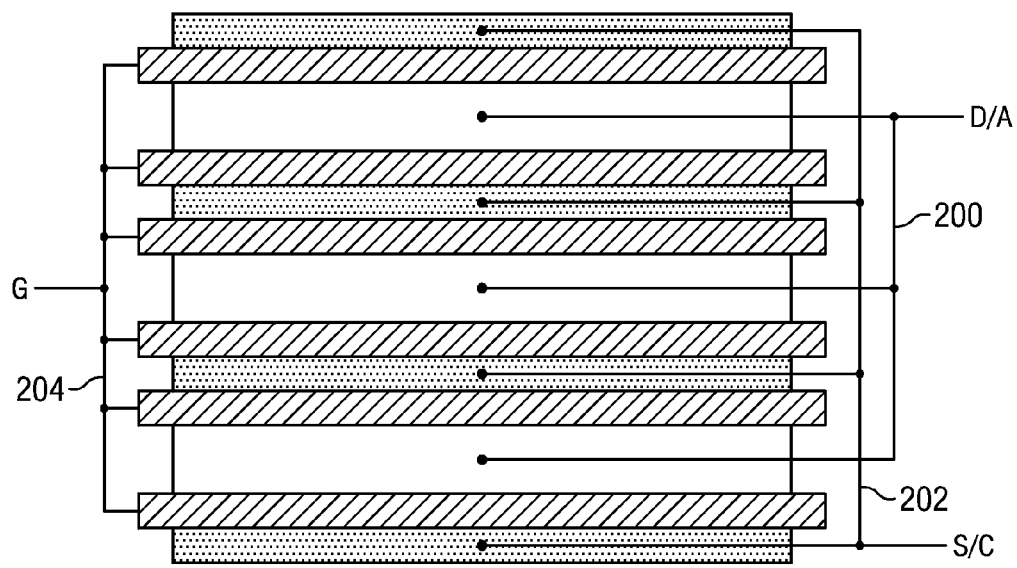
FIG. 2 is a plan view of a DMOS transistor with an SCR arranged in a ladder configuration according of the present invention.

Referring to FIG. 2, there is a plan view of a DMOS transistor with an SCR arranged in a ladder configuration according of the present invention. The exemplary DMOS transistor includes three drain regions extending in a first horizontal direction connected to lead 200. Four source regions extend in the first direction parallel to the drain regions and are connected to lead 202. Each drain and source region is separated by a channel region having an overlying gate connected to lead 204. Each drain region also serves as an anode and each source region also serves as a cathode for an SCR as will be discussed in detail. Taken together, the exemplary DMOS transistor is six parallel transistors or rungs of the ladder. The total width of the DMOS transistor may be from a few hundred microns to several thousand microns wide. Correspondingly, each rung of the ladder may be 50 microns to 200 microns in width. The width of the SCR included in the ladder structure is approximately the same as the width of the DMOS transistor. Thus, layout area of each rung of the ladder is of critical importance.

Figure 3:
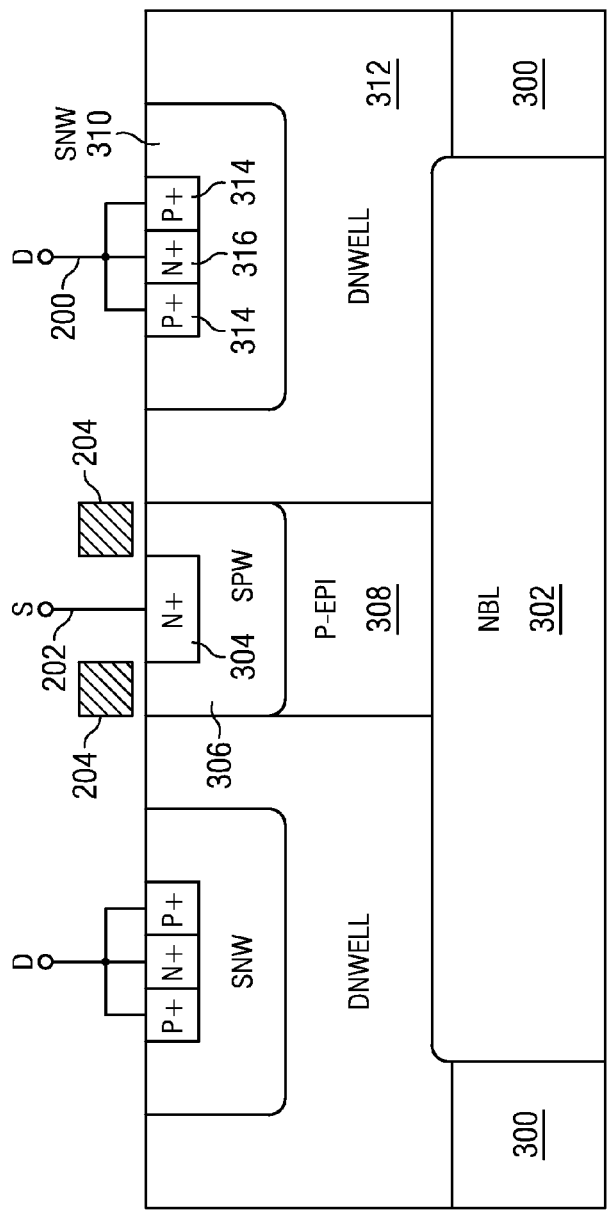
FIG. 3 is a cross sectional view of a part of the DMOS transistor and SCR of FIG. 2.

Turning now to FIG. 3, there is a cross sectional view of a part of the DMOS transistor and SCR of FIG. 2 representing two rungs of the ladder structure formed on P-type substrate 300. The right half of FIG. 3 is the same as the left half but flipped about a vertical central axis. Therefore, only the right half will be described in detail. Isolation regions are omitted for clarity but may be formed by local oxidation of silicon (LOCOS) or by shallow trench isolation (STI) as is well known by those of ordinary skill in the art. The DMOS transistor includes gate 204 overlying a channel region formed by shallow P well (SPW) region 306. The DMOS drain is formed by heavily doped N+ region 316, shallow N well (SNW) 310, and deep N well (DNWELL) 312, all of which are electrically connected to drain lead 200. The DMOS source is formed by heavily doped N+ region 304 and formed within shallow P well 306 over P epitaxial (P-EPI) region 308. N+ buried layer (NBL) 302 is formed under the deep N well region 312 to provide a low resistance connection for deep N well 312. The anode of the SCR of FIG. 3 is formed by heavily doped P+ region 314, which is electrically connected to drain lead 200. The cathode of the SCR is the same as the heavily doped N+ DMOS source 304.

Figure 4:
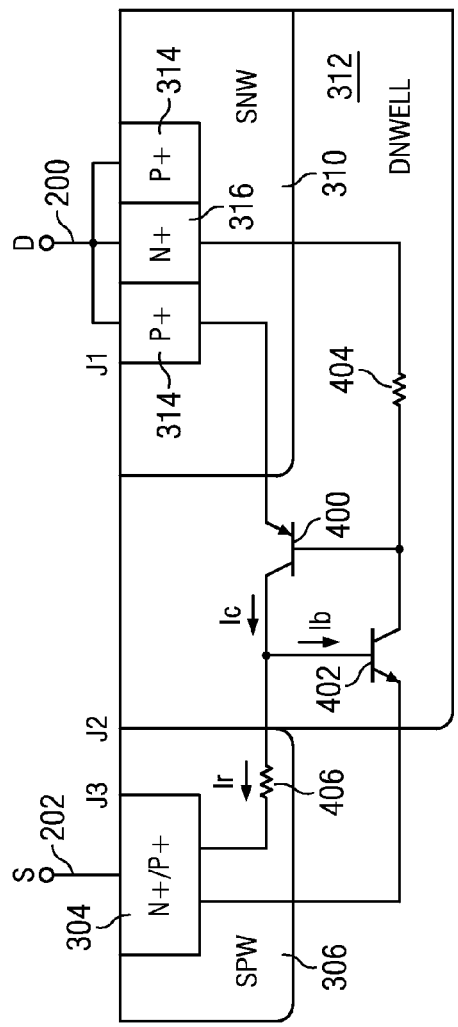
FIG. 4 is a cross sectional view of the right half of the DMOS transistor and SCR of FIG. 3.

Turning now to FIG. 4, there is a cross sectional view of the right half of the DMOS transistor and SCR of FIG. 3. The gate terminals 204 of FIG. 3 are omitted for clarity. Here and in the following discussion, the same reference numerals are used to identify the same elements of the various drawing figures. As previously mentioned, layout area of the DMOS and SCR are of critical importance for both circuit area as well as circuit performance. Minimum dimensions, however, are preferably determined by operating voltage requirements. For example, shallow N well 310 and deep N well 312 minimum overlap of heavily doped N+ drain 316 is designed to provide a drain to source and substrate breakdown voltage (BVdss) that is compatible with the operating voltage. Likewise, the shallow P well 306 overlap of heavily doped N+ source 304 is designed to avoid punch through at the desired operating voltage. Any additional space above these minimum operating requirements will increase drain or channel resistance of the DMOS device.

Figure 1A:
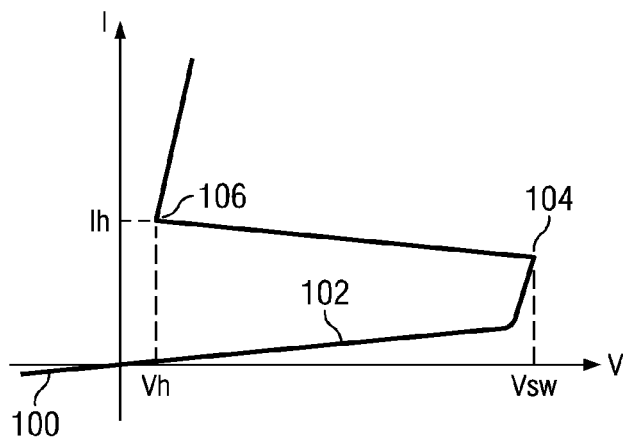
FIG. 1A is a current-voltage diagram of a semiconductor controlled rectifier (SCR) of the prior art.
Figure 1B:
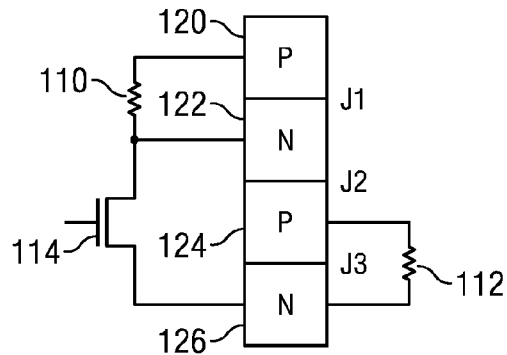
FIG. 1B is a simplified diagram of a double diffused metal oxide semiconductor (DMOS) transistor with an SCR of the prior art.

The SCR of FIG. 4 is illustrated in schematic form to show the main elements. A PNP transistor 400 of the SCR is formed by heavily doped P+ emitter 314, lightly doped N well base (310 and 312), and lightly doped P well collector 306. A NPN transistor 402 of the SCR is formed by lightly doped N well collector (310 and 312), lightly doped P well base 306, and heavily doped N+ emitter 304. Junctions J1 through J3 are indicated as previously described with respect to FIG. 1B. Resistors 404 and 406 correspond to resistors 110 and 112 of FIG. 1B. As previously discussed, the switching voltage of the SCR is determined in part by the avalanche threshold of linear junction J2. This is also the avalanche threshold of the drain junction of the DMOS transistor. Thus, there are two negative resistance devices in parallel, and both have approximately the same switching voltage. The SCR switching voltage (Vsw) 104 at FIG. 1A precedes a transition to a reduced holding voltage Vh and increased holding current 106. The parasitic NPN 402 of the DMOS transistor, which is common to the SCR, is also a negative resistance circuit. When subjected to sufficiently high voltage, NPN transistor 402 will transition to a reduced snapback voltage and increased snapback current. Here, snapback refers to a transition of the NPN transistor from the collector-base open emitter avalanche threshold (BVcbo) to a lower voltage near the collector-emitter open base breakdown voltage (BVceo). The snapback voltage will not reach BVceo, because of shunt resistor 406. However, if shunt resistor 404 is sufficiently low, NPN transistor 402 may snapback so the drain-to-source voltage between terminals 200 and 202 is less than the SCR switching voltage. In this state the SCR will not turn on, and the DMOS will fail at a much lower voltage than the SCR.

The present inventors have determined that a primary reason for a snapback transition prior to SCR switching is due to the value of shunt resistors 404 and 406. A lower value of shunt resistor 404 requires a greater collector current through NPN transistor 402 to forward bias the base-emitter junction (J1) of PNP transistor 400. A higher value of shunt resistor 404, therefore, will reduce the collector current required to forward bias PNP transistor 400 and turn on the SCR. Shunt resistor 404, however, is necessarily low to reduce drain resistance of the DMOS device for many operating conditions. Therefore, it may be undesirable for some applications to increase the resistance of shunt resistor 404 to reduce the SCR switching voltage. Alternatively, decreasing the value of shunt resistor 406 requires a greater collector current (Ic) through PNP transistor 400 to forward bias the base-emitter junction (J3) of NPN transistor 402. This is because collector current Ic is divided between shunt resistor 406 (Ir) and NPN transistor 402 base current (Ib). A higher value of shunt resistor 406, therefore, will reduce the collector current required to forward bias NPN transistor 402 and turn on the SCR. An increase in the value of shunt resistor 406, however, should not be accomplished by increasing the shallow P well 306 overlap of heavily doped N+ region 304, since this would increase the channel resistance as well as the layout area of the DMOS transistor.

Figure 5A:
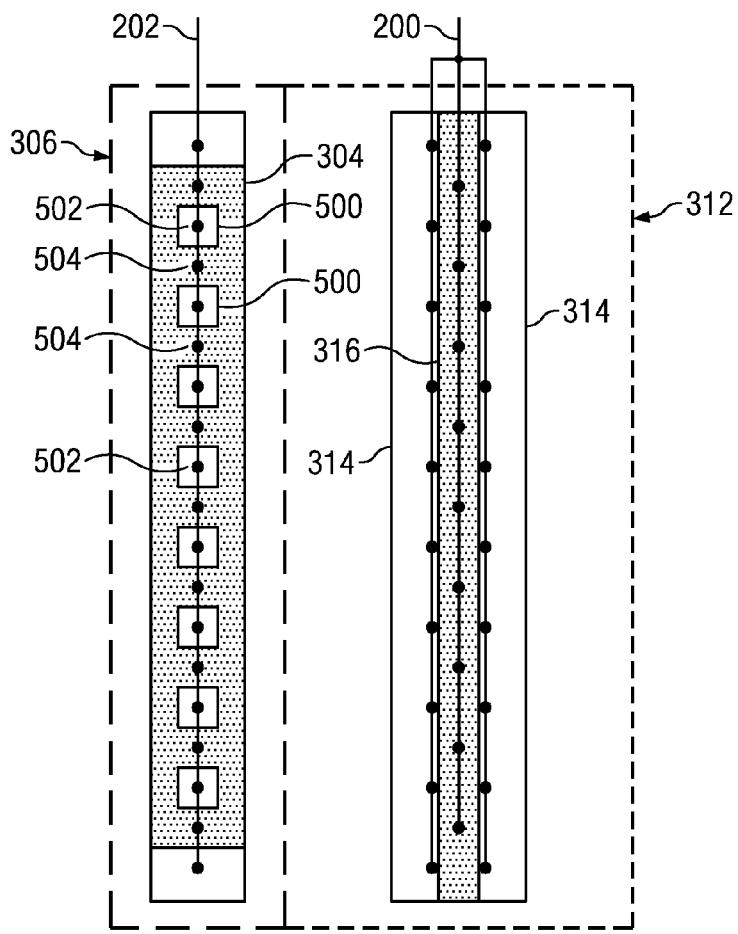
FIG. 5A is a plan view of anode and cathode circuits of a first embodiment of the SCR of FIG. 4.

Referring now to FIG. 5A, there is a plan view (top view) of anode and cathode circuits of a first embodiment of the SCR of FIG. 4. Details of the DMOS transistor presented in previous drawing figures are omitted for clarity. The anode circuit on the right is formed within deep N well region 312 and includes heavily doped P+ anode regions 314 and heavily doped N+ drain region 316. The anode regions 314 and the drain region 316 are connected by conductive lead 200 through contacts or vias indicated by the small black circles. The cathode circuit on the left is formed within shallow P well region 306 and includes heavily doped P+ well contact regions 500 and heavily doped N+ region 304. Heavily doped P+ well contact regions 500 are enclosed on the sides by heavily doped N+ region 304. The well contact regions 500 and the source region 304 are connected by conductive lead 202 through contacts or vias 502 and 504, respectively, indicated by the small black circles. In this first embodiment it is important to note that the contacts or vias (502, 504) are formed in a straight line together with P+ well contact regions 500. This advantageously reduces layout area required for the cathode circuit. Shallow P well 306 overlap of N+ region 304 is determined by operating voltage and must be sufficient to avoid DMOS punch through during normal operation. Furthermore, heavily doped P+ well contact regions 500 are spaced apart within the N+ region 304 by a distance approximately equal to a width of each P+ well contact region 500. The present inventors have determined that this spacing between P+ well contact regions 500 affects the value of shunt resistor 406 as will be explained in detail.

Figure 5B:
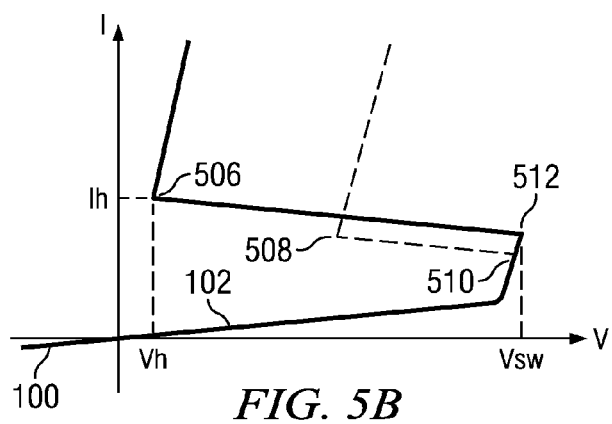
FIG. 5B is a current-voltage diagram of the SCR of FIG. 5A.

FIG. 5B is a current-voltage diagram of the SCR of FIG. 5A indicated by the solid line. The switching voltage and holding voltage of the SCR are indicated by points 512 and 506, respectively. The dashed line in FIG. 5B is the current-voltage characteristic of the NPN transistor 402, which is parasitic to the DMOS transistor. The avalanche voltage of NPN transistor 402 at junction J2 is indicated by point 510 and is slightly less than the switching voltage (Vsw) of the SCR at point 512. This difference is due in part to the value of shunt resistor 406. Here, it should be understood that NPN transistor 402 begins incipient avalanche conduction at a voltage greater than forward blocking region 102, but point 510 is the voltage and current at which it will snap back. Although the avalanche current of NPN transistor 402 may be sufficient to forward bias the base-emitter junction of PNP transistor 400, shunt resistor 406 current Ir is insufficient to develop a forward bias base-emitter voltage. Thus, NPN transistor 402 will snapback to snapback voltage and current 508. The SCR will not turn on at this voltage, since snapback voltage 508 is substantially less than SCR switching voltage 512. Snapback voltage 508, however, is substantially greater than the SCR holding voltage 506. Thus, NPN transistor 402 will dissipate substantially more power and generate substantially more heat at snapback voltage 508 than the SCR would at holding voltage 506.

Figure 5C:
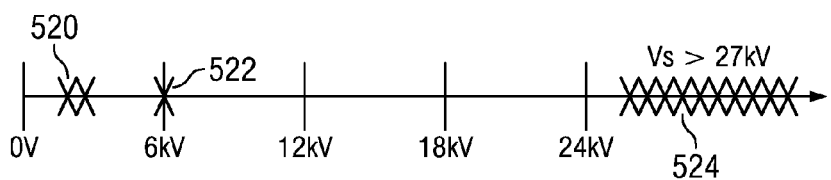
FIG. 5C is a diagram showing electrostatic discharge test results the SCR of FIG. 5A.

Turning now to FIG. 5C, there is a diagram showing electrostatic discharge test results the SCR of FIG. 5A. The SCR of FIG. 5A was step stress tested according to the method of IEC 61000-4-1 with a 200 pF load capacitor to simulate in circuit performance under worst case conditions. Stress voltage was applied from 0.2 kV through 4 kV in 200V steps. Above 4 kV stress voltage was applied in 500V steps. Several of the tested units failed in the range of 1.2 kV to 1.6 kV as indicated at 520. Another tested unit failed at 6 kV as indicated at 522. Remaining tested units failed above 27 kV as indicated at 524.

Figure 6A:
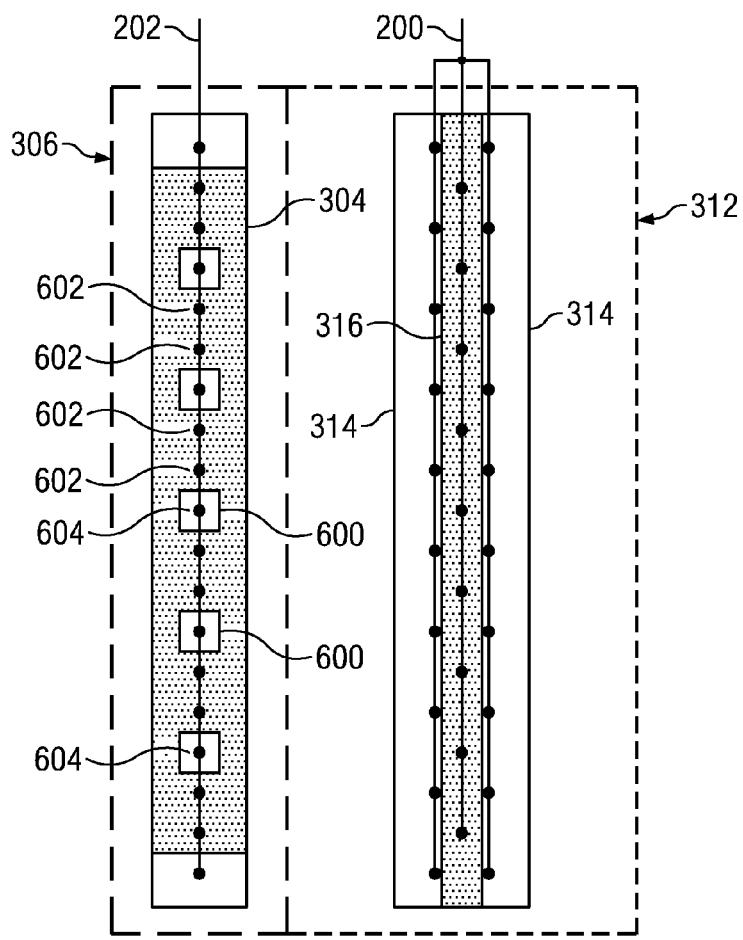
FIG. 6A is a plan view of anode and cathode circuits of a second embodiment of the SCR of FIG. 4.

Referring next to FIG. 6A, there is a plan view (top view) of anode and cathode circuits of a second embodiment of the SCR of FIG. 4. Details of the DMOS transistor presented in previous drawing figures are omitted for clarity. The anode and cathode circuit are similar to those previously described with regard to FIG. 5A. The heavily doped P+ well contact regions 600 and the N+ region 304 are connected by conductive lead 202 through contacts or vias 604 and 602, respectively, indicated by the small black circles. In this second embodiment, the contacts or vias (602, 604) are also formed in a straight line together with P+ well contact regions 600. In the cathode circuit of FIG. 6A, however, heavily doped P+ well contact regions 600 are spaced apart within the N+ region 304 by a distance approximately equal to twice a width of each P+ well contact region 600. This increased space advantageously increases the value of shunt resistor 406, thereby reducing the SCR switching voltage, without increasing layout area. Moreover, the increased number of vias or contacts 602 between conductive lead 202 and N+ region 304 advantageously reduces the source resistance of the DMOS transistor during normal circuit operation and reduces the cathode resistance of the SCR during ESD stress.

Figure 6B:
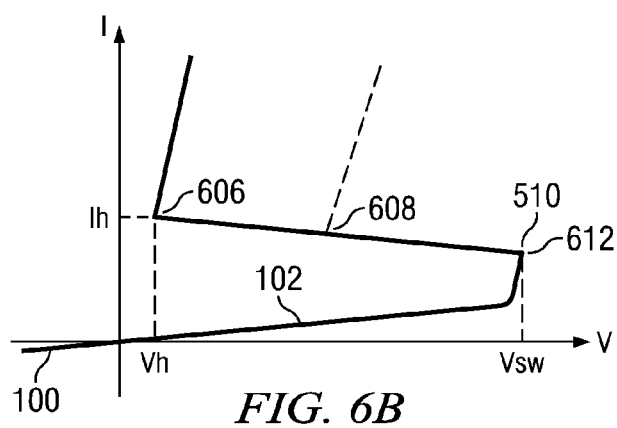
FIG. 6B is a current-voltage diagram of the SCR of FIG. 6A.

FIG. 6B is a current-voltage diagram of the SCR of FIG. 6A indicated by the solid line. The switching voltage and holding voltage of the SCR are indicated by points 612 and 606, respectively. The dashed line in FIG. 6B is the current-voltage characteristic of the NPN transistor 402. The avalanche voltage of NPN transistor 402 at junction J2 at point 510 is approximately the same as in FIG. 5B. The snapback voltage 608 is slightly less than 508 due to the increased value of shunt resistor 406. The switching voltage (Vsw) of the SCR at point 612 has also decreased to a value approximately equal to the avalanche voltage 510 of NPN transistor 402. The holding voltage and current 606 is also slightly less than 506 due to the increased value of shunt resistor 406.

Figure 6C:
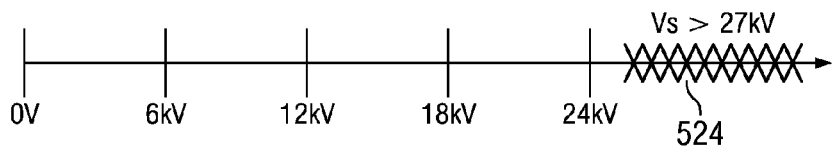
FIG. 6C is a diagram showing electrostatic discharge test results the SCR of FIG. 6A.

Turning now to FIG. 6C, there is a diagram showing electrostatic discharge test results for the SCR of FIG. 6A. The SCR of FIG. 6A was step stress tested as previously described with regard to FIG. 5A. Here, however, no failures were detected below 27 kV at 524.

Figure 7A:
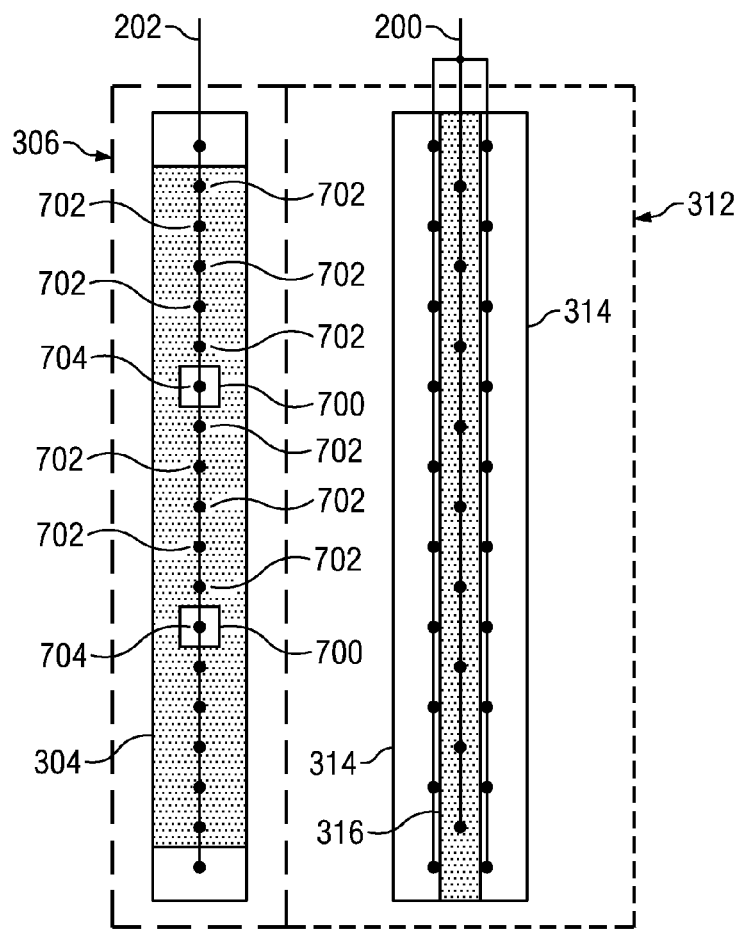
FIG. 7A is a plan view of anode and cathode circuits of a third embodiment of the SCR of FIG. 4.

Referring now to FIG. 7A, there is a plan view (top view) of anode and cathode circuits of a third embodiment of the SCR of FIG. 4. Details of the DMOS transistor presented in previous drawing figures are omitted for clarity. The anode and cathode circuit are similar to those previously described with regard to FIGS. 5A and 6A. The heavily doped P+ well contact regions 700 and the N+ region 304 are connected by conductive lead 202 through contacts or vias 704 and 702, respectively, indicated by the small black circles. In this third embodiment, the contacts or vias (702, 704) are also formed in a straight line together with P+ well contact regions 700. In the cathode circuit of FIG. 7A, however, heavily doped P+ well contact regions 700 are spaced apart within the N+ region 304 by a distance approximately equal to five times a width of each P+ well contact region 700. This increased space further advantageously increases the value of shunt resistor 406, thereby reducing the SCR switching voltage, without increasing layout area. As previously discussed, the increased number of vias or contacts 702 between conductive lead 202 and N+ region 304 advantageously reduces the source resistance of the DMOS transistor during normal circuit operation and reduces the cathode resistance of the SCR during ESD stress.

Figure 7B:
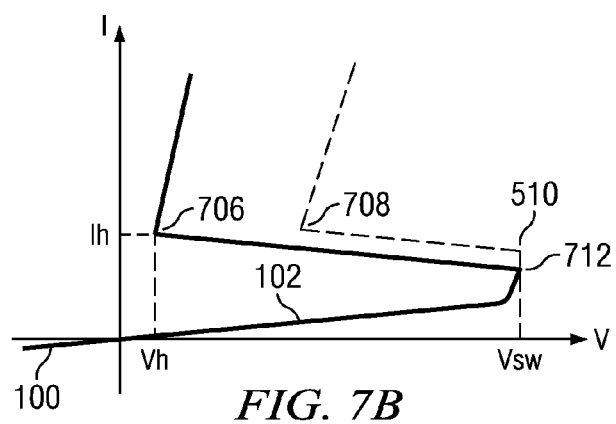
FIG. 7B is a current-voltage diagram of the SCR of FIG. 7A.

FIG. 7B is a current-voltage diagram of the SCR of FIG. 7A indicated by the solid line. The switching voltage and holding voltage of the SCR are indicated by points 712 and 706, respectively. The dashed line in FIG. 7B is the current-voltage characteristic of the NPN transistor 402. The avalanche voltage of NPN transistor 402 at junction J2 at point 510 is approximately the same as in FIGS. 5B and 6B. The snapback voltage 708 is slightly less than 608 due to the increased value of shunt resistor 406. The switching voltage (Vsw) of the SCR at point 712 has also decreased to a value less than the avalanche voltage 510 of NPN transistor 402 at junction J2. The holding voltage and current 706 is also slightly less than 606 due to the increased value of shunt resistor 406.

Figure 7C:
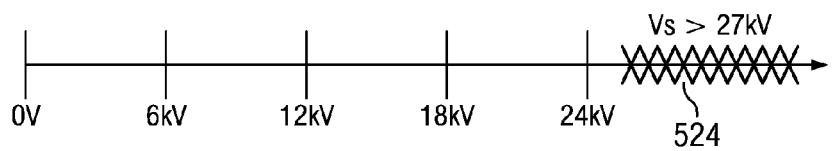
FIG. 7C is a diagram showing electrostatic discharge test results the SCR of FIG. 7A.

Turning now to FIG. 7C, there is a diagram showing electrostatic discharge test results the SCR of FIG. 7A. The SCR of FIG. 7A was step stress tested as previously described with regard to FIGS. 5A and 6A. Here, however, no failures were detected below 27 kV at 524. The additional space between P+ well contact regions 700 advantageously reduces the switching voltage and current 712 so that minor process variations will not induce the low voltage ESD failures described with regard to FIG. 5C.

Still further, while numerous examples have thus been provided, one skilled in the art should recognize that various modifications, substitutions, or alterations may be made to the described embodiments while still falling with the inventive scope as defined by the following claims. For example, preferred embodiments of the present invention have illustrated advantages of increased space between heavily doped P+ well contact regions 600 (FIG. 6A) and 700 (FIG. 7A). Previously described advantages of the present invention accrue for any space of at least three to seven times a width of the P+ well contact region. Moreover, the same advantage will accrue for discrete and spaced apart N+ well contact regions within the anode circuit when compatible with normal operating current of the DMOS transistor. Other combinations will be readily apparent to one of ordinary skill in the art having access to the instant specification.

What is claimed is:

1. A protection circuit, comprising:
   a first heavily doped region having a first conductivity type formed at a face of a substrate and extending in a first direction;
   a second heavily doped region having a second conductivity type formed at the face of the substrate extending in the first direction;
   a plurality of third heavily doped regions having the first conductivity type formed in the first direction within the second heavily doped region, wherein the third heavily doped regions are spaced apart by at least three times a width of a third heavily doped region; and
   a first conductive lead connected to each third heavily doped region and connected to the second heavily doped region by at least three spaced apart connections between every two third heavily doped regions.

2. A protection circuit as in claim 1, wherein the third heavily doped regions are formed in a straight line extending in the first direction.

3. A protection circuit as in claim 1, wherein said at least three comprises at least four.

4. A protection circuit as in claim 1, comprising:
   a first lightly doped region having the second conductivity type formed at a face of a substrate around the first heavily doped region; and
   a second lightly doped region having the first conductivity type formed at a face of the substrate around the second heavily doped region and electrically connected to the third heavily doped regions.

5. A protection circuit as in claim 4, comprising a double diffused metal oxide semiconductor (DMOS) transistor having a current path connected between the first lightly doped region and the second heavily doped region.

6. A protection circuit as in claim 1, wherein said first heavily doped region comprises an anode and wherein said second heavily doped region comprises a cathode.

7. A protection circuit as in claim 1, wherein said first heavily doped region comprises a cathode and wherein said second heavily doped region comprises an anode.

8. A circuit, comprising:
   a first lightly doped region having a second conductivity type formed at a face of a substrate;
   a first heavily doped region having a first conductivity type formed at a face of the substrate within the first lightly doped region and extending in a first direction;
   a second heavily doped region having the second conductivity type formed at the face of the substrate spaced apart from the first lightly doped region and extending in the first direction;
   a plurality of third heavily doped regions having the first conductivity type formed at the face of the substrate in the first direction within the second heavily doped region, wherein the third heavily doped regions are spaced apart by at least three times a width of a third heavily doped region;
   a double diffused metal oxide semiconductor (DMOS) transistor having a current path formed between the first lightly doped region and the second heavily doped region; and
   a first conductive lead connected to each third heavily doped region and connected to the second heavily doped region by at least three spaced apart connections between every two third heavily doped regions.

9. A circuit as in claim 8, wherein said first lightly doped region comprises a drain and wherein said second heavily doped region comprises a source.

10. A circuit as in claim 8, wherein the third heavily doped regions are formed in a straight line extending in the first direction.

11. A circuit as in claim 8, wherein said at least three comprises at least four.

12. A circuit as in claim 8, wherein said first heavily doped region comprises an anode and wherein said second heavily doped region comprises a cathode.

13. A circuit as in claim 8, wherein said first heavily doped region comprises a cathode and wherein said second heavily doped region comprises an anode.

14. A circuit as in claim 8, comprising a second lightly doped region having the first conductivity type formed at a face of a substrate around the second heavily doped region and electrically connected to the third heavily doped regions.

15. A circuit, comprising:
   an anode circuit having a first lightly doped region of a second conductivity type and having a first heavily doped region of a first conductivity type formed at a face of a substrate within and electrically connected to the first lightly doped region;
   a cathode circuit having a second heavily doped region of the second conductivity type formed at the face of the substrate and having a plurality of third heavily doped regions of the first conductivity type within the second heavily doped region;
   a first conductive lead connected to each third heavily doped region and connected to the second heavily doped region by at least three spaced apart connections between every two third heavily doped regions;
   a semiconductor controlled rectifier (SCR) connected between the anode circuit and the cathode circuit; and
   a double diffused metal oxide semiconductor (DMOS) transistor having a drain connected to the anode circuit and having a source connected to the cathode circuit.

16. A circuit as in claim 15, comprising a second lightly doped region having the first conductivity type and formed around at least part of the second and third heavily doped regions, wherein the second lightly doped region is electrically connected to each third heavily doped region.

17. A circuit as in claim 15, wherein said at least three spaced apart connections are formed in a straight line between the third heavily doped regions.

18. A circuit as in claim 15, wherein said at least three comprises at least four.

19. A circuit as in claim 15, wherein the DMOS transistor is a lateral DMOS (LDMOS) transistor, and wherein said first lightly doped region comprises a drain of the LDMOS transistor and said second heavily doped region comprises a source of the LDMOS transistor.

* * * * *